US008971050B2

(12) United States Patent
Lu

(10) Patent No.: US 8,971,050 B2
(45) Date of Patent: Mar. 3, 2015

(54) CIRCUIT BOARD ASSEMBLY HAVING TWO MEMBERS ROTATING IN OPPOSITE DIRECTIONS

(71) Applicant: ScienBiziP Consulting (Shenzhen) Co., Ltd., Shenzhen (CN)

(72) Inventor: Wen-Hu Lu, Shenzhen (CN)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 22 days.

(21) Appl. No.: 13/931,576

(22) Filed: Jun. 28, 2013

(65) Prior Publication Data

US 2014/0154900 A1 Jun. 5, 2014

(30) Foreign Application Priority Data

Dec. 4, 2012 (CN) .......................... 2012 1 05116679

(51) Int. Cl.
*H05K 5/00* (2006.01)
*H01R 13/62* (2006.01)
*H01R 12/71* (2011.01)
*H05K 10/00* (2006.01)

(52) U.S. Cl.
CPC .............. *H01R 12/716* (2013.01); *H05K 10/00* (2013.01)
USPC .......................................... 361/752; 439/157

(58) Field of Classification Search
USPC .......... 439/157–160; 361/736, 755, 752, 748, 361/798
See application file for complete search history.

(56) References Cited

U.S. PATENT DOCUMENTS

| 5,644,470 | A  | * | 7/1997  | Benedict et al. | ......... 361/679.32 |
|-----------|----|---|---------|-----------------|----------------------|
| 6,884,096 | B2 | * | 4/2005  | Centola et al.  | ................ 439/157 |
| 7,145,780 | B2 | * | 12/2006 | Malone et al.   | ................ 361/752 |
| 8,105,098 | B2 | * | 1/2012  | Teoh et al.     | .................... 439/157 |
| 2005/0243533 | A1 | * | 11/2005 | Malone et al. | ................ 361/801 |

* cited by examiner

*Primary Examiner* — Chandrika Prasad
(74) *Attorney, Agent, or Firm* — Novak Druce Connolly Bove + Quigg LLP

(57) ABSTRACT

A circuit board assembly comprises a first circuit board and a second circuit board. A connector socket is mounted on the first circuit board, and a connector plug is mounted on the second circuit board. A handle assembly is attached to either the first circuit board or the second circuit board. The handle assembly comprises a base member attached to either the first circuit board or the second circuit board and first and second rotating members pivotably attached to opposite ends of the base member. When the first rotating member and the second rotating member are rotated away from the base member, the connector plug is disengaged from the connector socket. When the first rotating member and the second rotating member are rotated towards the base member, the connector plug is inserted into the connector socket.

20 Claims, 7 Drawing Sheets

CIRCUIT BOARD ASSEMBLY HAVING TWO MEMBERS ROTATING IN OPPOSITE DIRECTIONS

BACKGROUND

1. Technical Field

The present disclosure relates to circuit board assemblies, and more particularly to a circuit board assembly with a handle assembly.

2. Description of Related Art

A circuit board assembly comprises a first circuit board and a second circuit board attached to the first circuit board. The first circuit board comprises a connector socket, while the second circuit board comprises a connector plug inserted into the connector socket. The problem with this setup is that an operator may have to exert a great effort to connect or disconnect the connector plug to or from the connector socket.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean "at least one."

Figure 1:
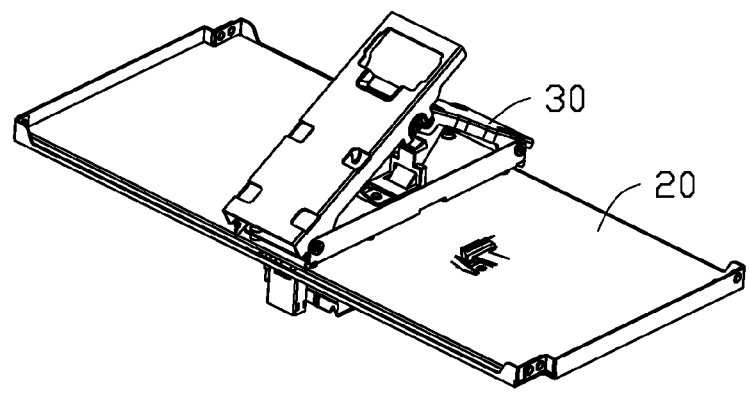
FIG. 1 is an exploded, isometric view of a circuit board assembly according to an embodiment.
Figure 1:
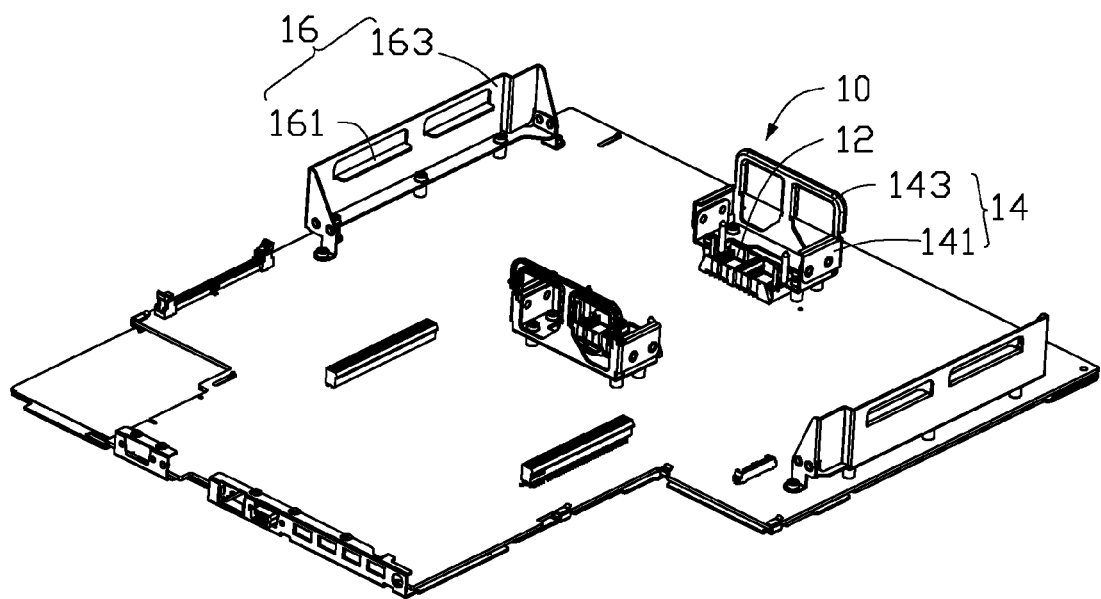
Figure 2:
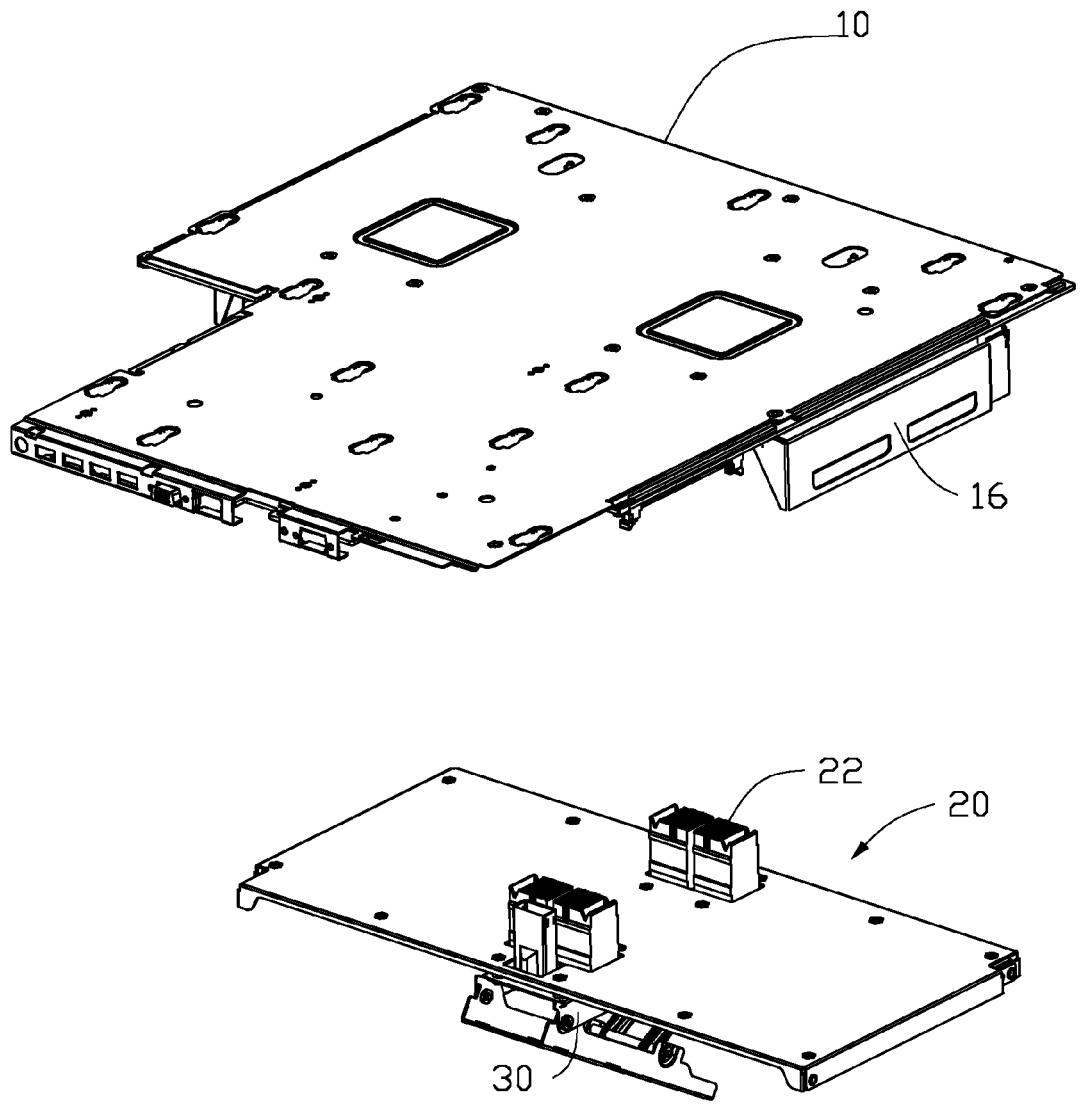
FIG. 2 is similar to FIG. 1, but viewed from another aspect.

FIGS. 1 and 2 show an embodiment of a circuit board assembly comprising a first circuit board 10, a second circuit board 20, and a handle assembly 30 attached to the second circuit board 20.

The first circuit board 10 comprises two pairs of connector sockets 12, a pair of first supporting brackets 14, and a pair of second supporting brackets 16. Each of the two pairs of connector sockets 12 is located adjacent to a pair of first supporting brackets 14. Each of the pair of first supporting brackets 14 comprises a main piece 143 and a pair of first supporting flanges 141, extending substantially perpendicularly from opposite sides of the main piece 143. The main piece 143 and the pair of first supporting flanges 141 are substantially perpendicular to the first circuit board 10. Each of the pair of second supporting brackets 16 comprises a main plate 163 and a pair of second supporting flanges 161, extending substantially perpendicularly from the main plate 163. A distance between the pair of first supporting brackets 14 is substantially equal to a width of the second circuit board 20, and a distance between the pair of second supporting brackets 16 is substantially equal to a length of the second circuit board 20. The second circuit board 20 comprises two pairs of connecter plugs 22 mating with the two pairs of connector sockets 12.

Figure 3:
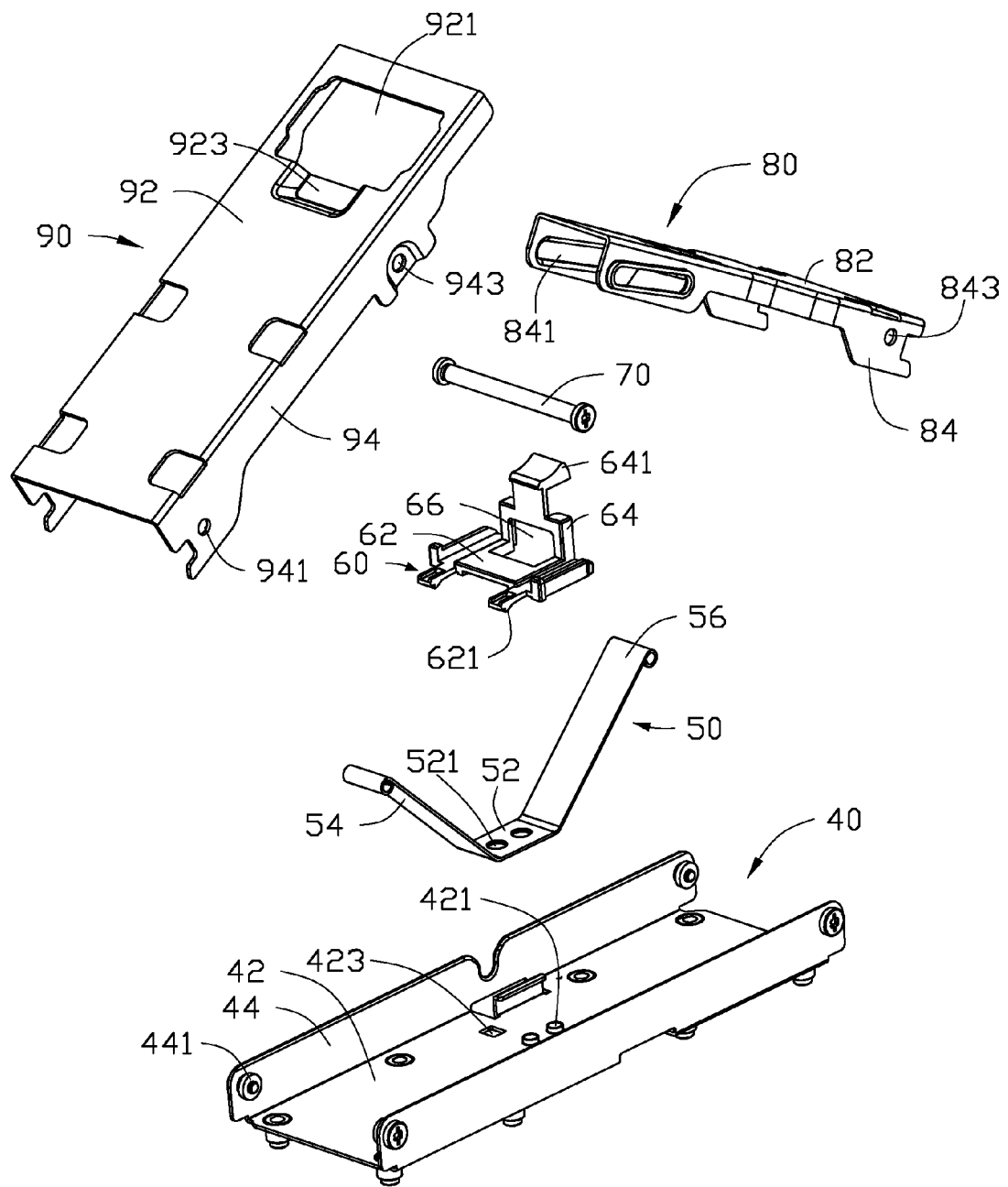
FIG. 3 is an exploded, enlarged view of a handle assembly of the circuit board assembly of FIG. 1.
Figure 4:
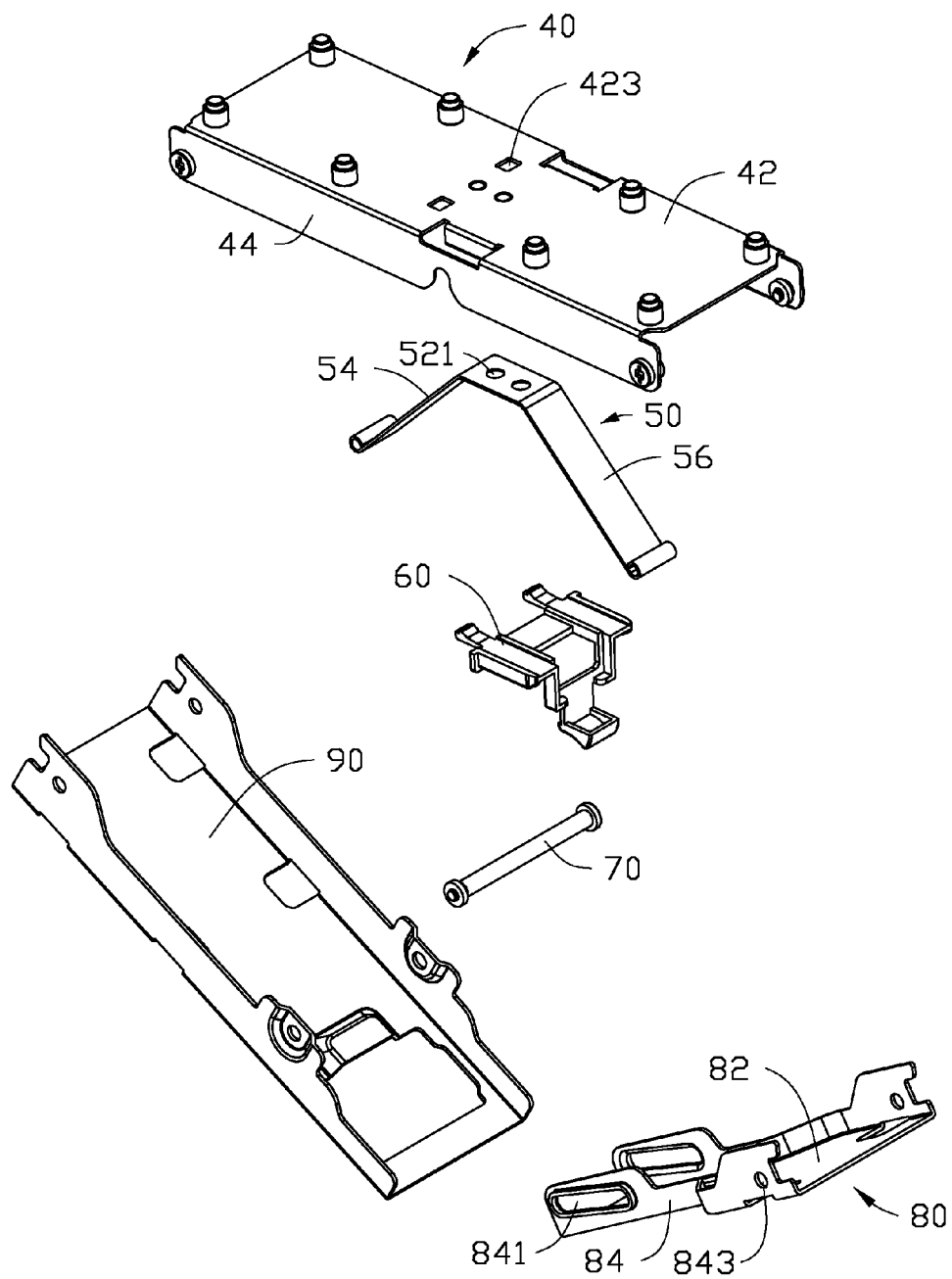
FIG. 4 is similar to FIG. 3, but viewed from another aspect.

FIGS. 3 and 4 show the handle assembly 30 comprising a base member 40, a resilient member 50, a latch member 60, a mounting shaft 70, a first rotating member 80, and a second rotating member 90.

The base member 40 comprises a base plate 42 and a pair of sidewalls 44, extending substantially perpendicularly from opposite side edges of the base plate 42. A pair of first mounting holes 423 is defined in a central portion of the base plate 42. A pair of mounting posts 421 protrudes from the base plate 42 and is located adjacent to the pair of first mounting holes 423. Two pairs of pivot mounting members 441 are attached to opposite ends of the pair of sidewalls 44 for pivotably mounting the first rotating member 80 and the second rotating member 90.

The resilient member 50 is integrally formed and comprises a flat part 52, a first slanting part 54, and a second slanting part 56. The first slanting part 54 extends from a first end of the flat part 52 in a first slanting direction relative to the flat part 52. The second slanting part 56 extends from a second end of the flat part 52 in a second slanting direction relative to the flat part 52. A length of the second slanting part 56 is greater than that of the first slanting part 54. A first angle, between the first slanting part 54 and the flat part 52, and a second angle, between the second slanting part 56 and the flat part 52, are greater than 90 degrees, but less than 180 degrees. The first angle is less than the second angle. The distal ends of the first slanting part 54 and the second slanting part 56 form an edge curl. A pair of second mounting holes 521 is defined in the flat part 52 corresponding to the pair of mounting posts 421.

The latch member 60 comprises a horizontal plate 62 and a vertical plate 64 perpendicularly connected to the horizontal plate 62. An opening 66 is defined in a conjunction portion of the horizontal plate 62 and the vertical plate 64. A pair of resilient hooks 621 extends out from the horizontal plate 62 corresponding to the pair of first mounting holes 423. A resilient button 641 extends from an upper end of the vertical plate 64. The resilient button 641 has a thin end and a thick end protruding from opposite sides of the vertical plate 64.

The first rotating member 80 comprises a first main plate 82 and a pair of first side plates 84 extending substantially perpendicularly from opposite side edges of the first main plate 82. A first pivot mounting hole 843 and a sliding slot 841 are defined in each of the pair of first side plates 84. The first pivot mounting holes 843 are located adjacent to a rear end of each of the pair of first side plates 84, while the sliding slots 841 are located adjacent to a front end of each of the pair of first side plates 84.

The second rotating member 90 comprises a second main plate 92 and a pair of second side plates 94, extending substantially perpendicularly from opposite side edges of the second main plate 92. A second pivot mounting hole 941 is defined in each of the pair of second side plates 94. An operating opening 921 is defined in the second main plate 92 for facilitating grasping of the second rotating member 90. The operating opening 921 is located adjacent to a rear end of the second main plate 92. The second main plate 92 further comprises a sunken portion 923 located at a front edge of the operating opening 921 corresponding to the resilient button 641. A circular hole 943 is defined in each of the pair of second side plates 94 near the sunken portion 923 for engaging with the mounting shaft 70. A distance between the pair of sidewalls 44 is enough to receive the pair of second side plates 94, and the distance between the pair of second side plates 94 is enough to receive the pair of first side plates 84. A length of the second main plate 92 is less than a length of the base plate 42, but greater than the length of the first main plate 82.

Figure 5:
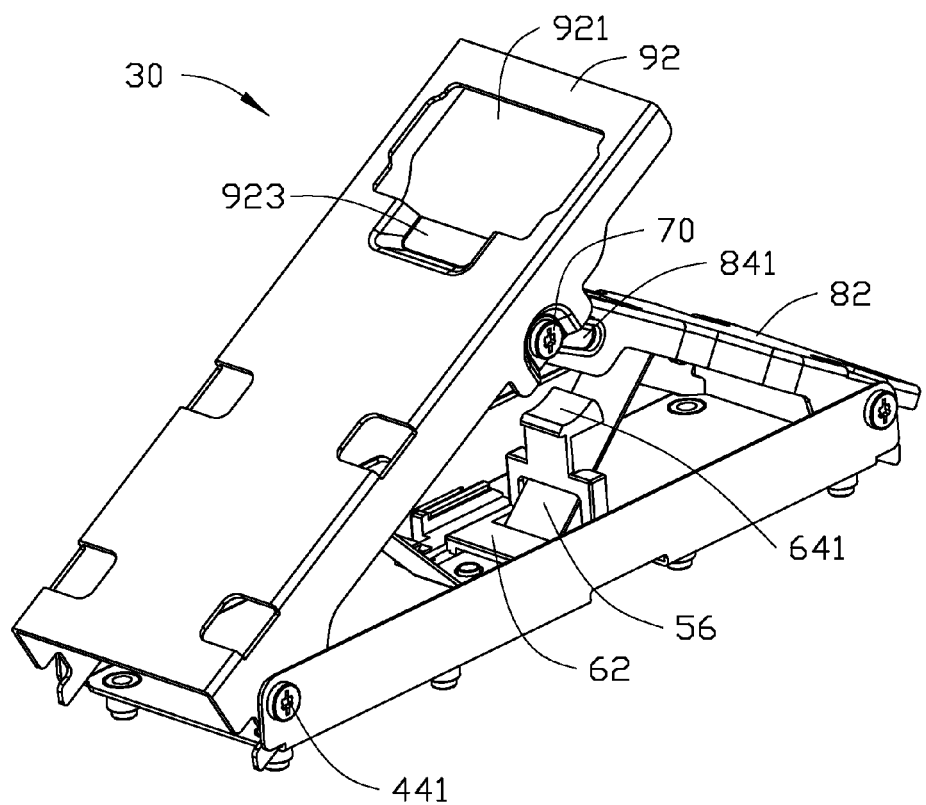
FIG. 5 is an assembled view of the handle assembly of FIG. 3 in an unlocked state.
Figure 6:
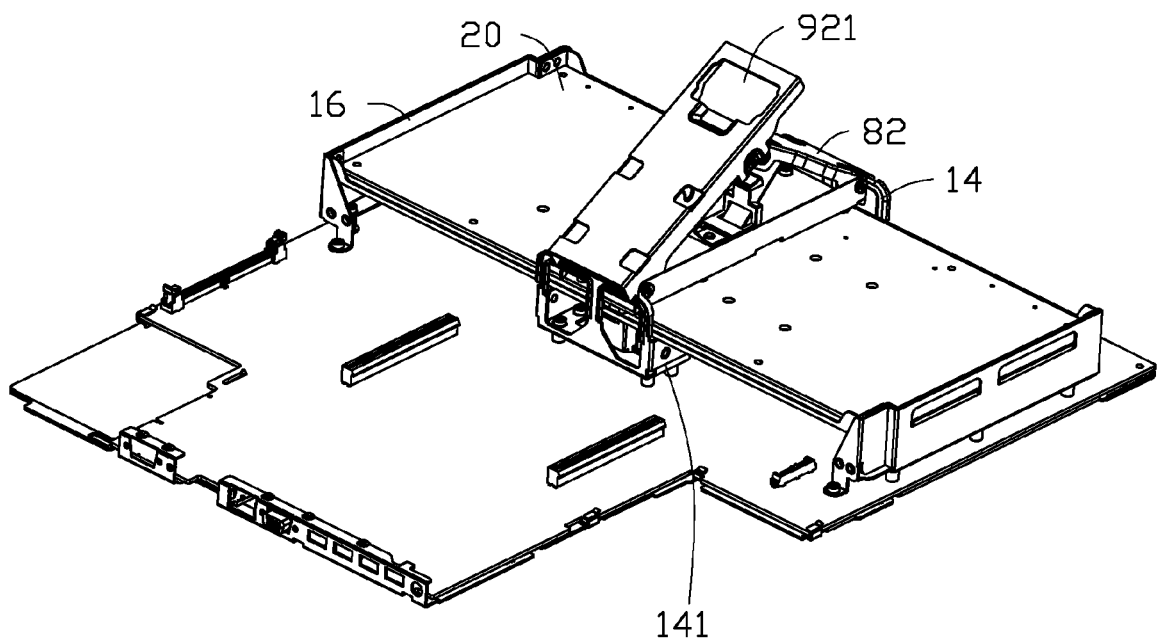
FIG. 6 is an assembled view of the circuit board assembly of FIG. 1, showing the handle assembly in an unlocked state.
Figure 7:
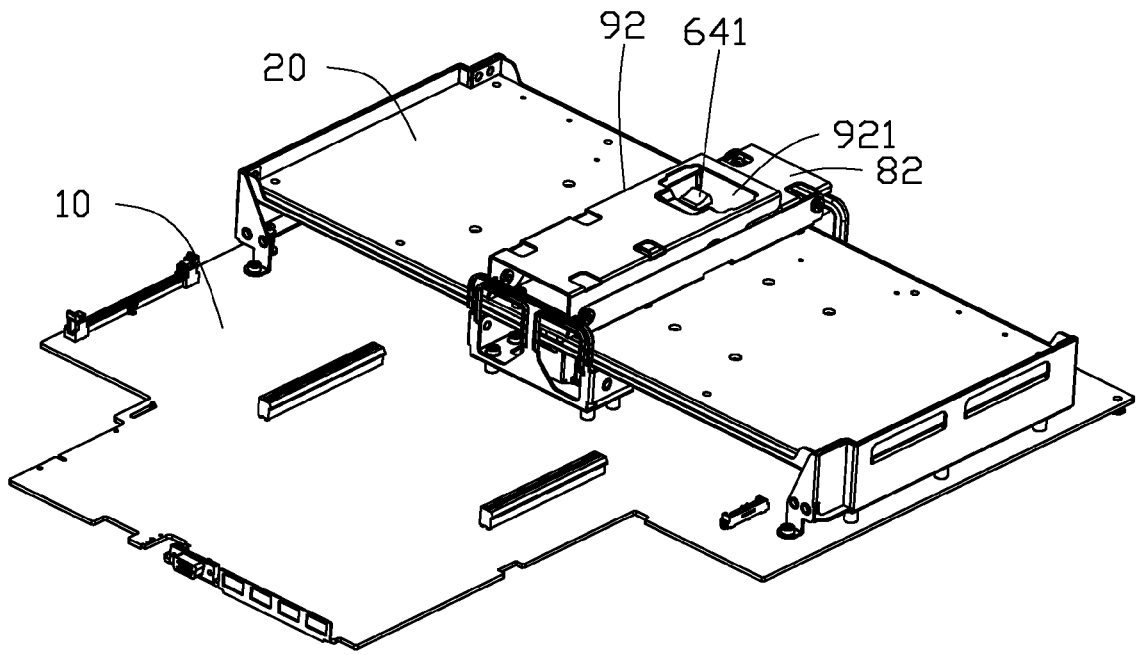
FIG. 7 is an assembled view of the circuit board assembly of FIG. 1, showing the handle assembly in a locked state.

FIGS. 5 to 7 show that in assembly, the pair of mounting posts 421 is received in the pair of second mounting holes 521, to mount the resilient member 50 onto the base plate 42. The second slanting part 56 extends through the opening 66, and the horizontal plate 62 is placed on the flat part 52. The pair of resilient hooks 621 is received in the pair of first mounting holes 423 to mount the latch member 60 onto the base member 40. Each pair of pivot mounting members 441 is received in the first pivot mounting holes 843 and the second pivot mounting holes 941, such that the first rotating member 80 and the second rotating member 90 are pivotably attached to opposite ends of the pair of sidewalls 44. The mounting shaft 70 extends through the circular holes 943 and the sliding slots 841 to connect the first rotating member 80 to the second rotating member 90. The first rotating member 80 is rotatable along a first rotation direction. The second rotating member 90 is rotatable along a second rotation direction opposite to the first rotation direction. When the first rotating member 80 and the second rotating member 90 are rotating, the mounting shaft 70 slides along the sliding slot 841. The base plate 42 is secured in a predetermined position on the second circuit board 20. The two pairs of connector plugs 22 and the handle assembly 30 are located on opposite sides of the second circuit board 20.

In one embodiment, the handle assembly 30 can be secured on the first circuit board 10.

The handle assembly 30 is switchable between an unlocked position (see FIGS. 5 and 6) and a locked position (See FIG. 7). In the unlocked position, the resilient member 50 is in an original state. A distal end of the first slanting part 54 abuts against the second rotating member 90, while a distal end of the second slanting part 56 abuts against the first rotating member 80. The mounting shaft 70 is located at a front end of the sliding slot 841, and the first rotating member 80 and the second rotating member 90 are slanted relative to the base plate 42.

To switch the handle assembly 30 from the unlocked position to the locked position, the second rotating member 90 is grasped by the operating opening 921 and pushed downward. The second rotating member 90 is rotated along the second rotation direction, causing the first rotating member 80 to rotate along the first rotation direction. The sunken portion 923 deforms the resilient button 641 until it moves across the thin end of the resilient button 641. The resilient button 641 rebounds to its natural position. The sunken portion 923 is hooked by the thin end of the resilient button 641. Therefore, the second rotating member 90 and the first rotating member 80 are secured in the locked position.

To connect the first circuit board 10 to the second circuit board 20, the two pairs of connector plugs 22 are aligned with the two pairs of connector sockets 12, and the second rotating member 90 and the first rotating member 80 are rotated into the locked position. The handle assembly 30 exerts force on the second circuit board 20 to insert the two pairs of connector plugs 22 into the two pairs of connector sockets 12. Therefore, the second circuit board 20 is connected to the first circuit board 10.

To disconnect the second circuit board 20 from the first circuit board 10, the second rotating member 90 and the first rotating member 80 are pulled from the locked position into the unlocked position. The handle assembly 30 exerts a pulling force on the second circuit board 20, such that the two pairs of connector plugs 22 are removed from the two pairs of connector sockets 12. Therefore, the second circuit board 20 is detached from the first circuit board 10.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A circuit board assembly comprising:
   a first circuit board comprising at least one connector socket;
   a second circuit board comprising at least one connector plug capable of mating with the at least one connector socket; and
   a handle assembly comprising a base member fixed on either the first circuit board or the second circuit board, a first rotating member, and a second rotating member; and the first rotating member and the second rotating member are pivotably attached to opposite ends of the base member and rotatable along opposite rotation directions;
   wherein when the first rotating member and the second rotating member are rotated away from the base member, the at least one connector plug is disengaged from the at least one connector socket; and when the first rotating member and the second rotating member are rotated towards the base member, the at least one connector plug is inserted into the at least one connector socket.

2. The circuit board assembly of claim 1, wherein the handle assembly further comprises a resilient member, the resilient member comprises a flat part mounted on the base member, a first slanting part extending from a first distal end of the flat part along a first slanting direction, and a second slanting part extending from a second distal end of the flat part along a second slanting direction; and the first slanting part buts the second rotating member, and the second slanting part abuts the first rotating member.

3. The circuit board assembly of claim 2, wherein a first angle between the first slanting part and the flat part is greater than 90 degrees, but less than 180 degrees; and a second angle between the second slanting part and the flat part is greater than 90 degrees, but less than 180 degrees.

4. The circuit board assembly of claim 2, wherein the handle assembly further comprises a latch member mounted on the base member; the second rotating member is rotatable towards the base member along a first rotation direction, until being latched by the latch member; and the resilient member is capable of urging the second rotating member to rotate away from the base member along a second rotation direction after the second rotating member is unlocked by the latch member.

5. The circuit board assembly of claim 4, wherein an operating opening is defined in the second rotating member, the second rotating member comprises a first end, located adjacent to the operating opening, and a second end, pivotably attached to the base member.

6. The circuit board assembly of claim 5, wherein the latch member comprises a horizontal plate mounted on the base member, a vertical plate perpendicularly connected to the horizontal plate, and a resilient button extending from an upper end of the vertical part; the resilient button comprises a thin end and a thick end which protrude from opposite sides of the vertical part; and the second rotating member comprises a sunken portion located at an inner edge of the operating opening for engaging with the thin end.

7. The circuit board assembly of claim 4, wherein the first rotation direction is opposite to the second rotation direction; when the second rotating member is rotating along the first rotation direction, an angle between the second rotating member and the base member decreases; and when the second rotating member is rotating along the second rotation direction, the angle between the second rotating member and the base member increases.

8. The circuit board assembly of claim 7, wherein the first rotating member is connected to the second rotating member and rotatable together with the second rotating member; when the second rotating member is rotating towards the base member along the first rotation direction, the first rotating member is rotating towards the base member along the second rotation direction; and when the second rotating member is rotating away from the base member along the second rotation direction, the first rotating member is rotating away from the base member along the first rotation direction.

9. The circuit board assembly of claim 8, wherein the first rotating member comprises at least one sliding slot, the second rotating member comprises at least one circular hole corresponding to the at least one sliding slot, and a mounting shaft extends through the at least one sliding slot and the at least one circular hole for connecting the first rotating member and the second rotating member.

10. The circuit board assembly of claim 9, wherein when the first rotating member and the second rotating member are rotating, the mounting shaft slides along the sliding slot.

11. A circuit board assembly comprising:
a first circuit board comprising at least one connector socket;
a second circuit board comprising at least one connector plug capable of mating with the at least one connector socket; and
a handle assembly comprising a base member fixed on either the first circuit board or the second circuit board, a first rotating member, a second rotating member, and a latch member; and the first rotating member and the second rotating member are pivotably attached to opposite ends of the base member and rotatable along opposite rotation directions;
wherein when the first rotating member and the second rotating member are rotatable between a locked position to a unlocked position, in the locked position, the at least one connector plug is engaged with the at least one connector socket, and the second rotating member is latched by the latch member; in the unlocked position, the at least one connector plug is disengaged from the at least one connector socket, and the second rotating member is released from the latch member.

12. The circuit board assembly of claim 11, wherein the handle assembly further comprises a resilient member, the resilient member comprises a flat part mounted on the base member, a first slanting part extending from a first distal end of the flat part along a first slanting direction, and a second slanting part extending from a second distal end of the flat part along a second slanting direction; and the first slanting part buts the second rotating member, and the second slanting part abuts the first rotating member.

13. The circuit board assembly of claim 12, wherein a first angle between the first slanting part and the flat part is greater than 90 degrees, but less than 180 degrees; and a second angle between the second slanting part and the flat part is greater than 90 degrees, but less than 180 degrees.

14. The circuit board assembly of claim 12, wherein the second rotating member is rotatable towards the base member along a first rotation direction, until being latched by the latch member; and the resilient member is capable of urging the second rotating member to rotate away from the base member along a second rotation direction after the second rotating member is unlocked by the latch member.

15. The circuit board assembly of claim 14, wherein an operating opening is defined in the second rotating member, the second rotating member comprises a first end, located adjacent to the operating opening, and a second end, pivotably attached to the base member.

16. The circuit board assembly of claim 15, wherein the latch member comprises a horizontal plate mounted on the base member, a vertical plate perpendicularly connected to the horizontal plate, and a resilient button extending from an upper end of the vertical part; the resilient button comprises a thin end and a thick end which protrude from opposite sides of the vertical part; and the second rotating member comprises a sunken portion located at an inner edge of the operating opening for engaging with the thin end.

17. The circuit board assembly of claim 14, wherein the first rotation direction is opposite to the second rotation direction; when the second rotating member is rotating along the first rotation direction, an angle between the second rotating member and the base member decreases; and when the second rotating member is rotating along the second rotation direction, the angle between the second rotating member and the base member increases.

18. The circuit board assembly of claim 17, wherein the first rotating member is connected to the second rotating member and rotatable together with the second rotating member; when the second rotating member is rotating towards the base member along the first rotation direction, the first rotating member is rotating towards the base member along the second rotation direction; and when the second rotating member is rotating away from the base member along the second rotation direction, the first rotating member is rotating away from the base member along the first rotation direction.

19. The circuit board assembly of claim 18, wherein the first rotating member comprises at least one sliding slot, the second rotating member comprises at least one circular hole corresponding to the at least one sliding slot, and a mounting shaft extends through the at least one sliding slot and the at least one circular hole for connecting the first rotating member and the second rotating member.

20. The circuit board assembly of claim 19, wherein when the first rotating member and the second rotating member are rotating, the mounting shaft slides along the sliding slot.

* * * * *